United States Patent [19]

Chaki

[11] Patent Number: 4,501,166
[45] Date of Patent: Feb. 26, 1985

[54] CROSS ARM MECHANISM IN A PUSHBUTTON TUNER

[75] Inventor: Takao Chaki, Tokyo, Japan

[73] Assignee: Clarion Co., Ltd., Tokyo, Japan

[21] Appl. No.: 391,889

[22] Filed: Jun. 23, 1982

[30] Foreign Application Priority Data

Jun. 30, 1981 [JP] Japan .................. 56-100480

[51] Int. Cl.³ .............................. H03J 5/12
[52] U.S. Cl. .......................... 74/10.33; 334/7
[58] Field of Search ............... 74/10.33; 334/7

[56] References Cited

U.S. PATENT DOCUMENTS

| 3,534,618 | 10/1970 | Teaf | 74/10.33 |
| 3,668,937 | 6/1972 | O'Neal | 74/10.33 |
| 4,248,102 | 2/1981 | Shimazu et al. | 74/10.33 |

FOREIGN PATENT DOCUMENTS

| 2446401 | 10/1975 | Fed. Rep. of Germany | 334/7 |
| 2950200 | 7/1980 | Fed. Rep. of Germany | 74/10.33 |
| 7805396 | 11/1978 | Netherlands | 74/10.33 |

Primary Examiner—Allan D. Herrmann
Attorney, Agent, or Firm—Flynn, Thiel, Boutell & Tanis

[57] ABSTRACT

In a cross arm mechanism in a pushbutton tuner including a setting plate pivotally coupled to a setting pin provided on a cross arm and a plate spring so mounted as to surround the setting plate whereby fixing the setting plate to the cross arm when a pushbutton is mounted on the cross arm, an improvement which comprises a sectorial protuberance formed on one surface of the setting plate, a guide hole in a symmetrical V-like configuration formed in the cross arm for receiving the sectorial protuberance, a suppressing means for suppressing the sectorial protuberance toward the narrowed portion of said V-like guide hole.

2 Claims, 5 Drawing Figures

CROSS ARM MECHANISM IN A PUSHBUTTON TUNER

BACKGROUND OF THE INVENTION

The invention relates to a cross arm mechanism in a pushbutton tuner.

In a pushbutton tuner, a setting plate mounted on a cross arm is rotatable and is changeable in its fixed angle to vary the moving distance of a memory slide to be pushed by the setting plate and to further have a core interlocking with the memory slide advance up to a given position in a tuning coil, thereby selecting a desired waveband.

To fix the setting plate at a desired angle on the cross arm in such a pushbutton tuner, a structure as shown in FIG. 1 has conventionally been adopted. Namely, the setting plate 3 is pivotally mounted at one end thereof on the cross arm 1 by means of a pin 2. The other end of the setting plate is pressed downwardly by a plate spring 4 so as not to rotate when tuning is done. Such conventional mechanism, however, is arranged to press the setting plate from above and accordingly requiring of a setting pin 5 of a considerable height pressing the plate spring 4 downwardly so to ensure its function as a spring, makes whereby the cross arm is relatively thick as a whole.

In this connection, in accordance with the recent necessity of thinning pushbutton tuners, the above-mentioned conventional mechanism as shown in FIG. 1 has been replaced by a new mechanism as shown in FIG. 2 in which the setting plate is fixed by applying a grasping force from the lateral sides thereof. Namely, the setting plate 13 is pivotally mounted on the cross arm 11 by means of a setting pin 12 having a flange at the top end thereof. The setting plate 13 has a cylindrical boss 14 integrally formed at lower portion thereof. The boss 14 is surrounded by a plate spring 15 in a U-like configuration which grasps the boss 14 from the right and left directions when a pushbutton advances so as not to permit the setting plate 13 to rotate about the setting pin 12. Such mechanism certainly contributes to a reduction of the thickness of the cross arm mechanism as a whole as compared with that as shown in FIG. 1. However, when practically adopting it, there has been a drawback: because the setting plate 13 has to be pivotal with respect to the setting pin 12, there must be provided a clearance between the setting pin 12 and the shaft bore of the setting plate 13. This sometimes causes discrepancy of its center line depending on whether it is freely rotatable or is fixed by the plate spring. Such discrepancy of its center line makes it impossible to precisely determine the position of the setting plate corresponding to wavebands to be selected and causes frequency deviation. This causes deterioration of performance of the pushbutton tuner.

OBJECT OF THE INVENTION

It is therefore an object of the present invention to overcome such drawbacks of the cross arm mechanism in pushbutton tuners by providing a cross arm mechanism in a pushbutton tuner in which the setting plate always keeps its center line at the same position also while the setting plate is fixed by the plate spring.

SUMMARY OF THE INVENTION

In accordance with the present invention, there is provided a cross arm mechanism in a pushbutton tuner which comprises:
 at least one cross arm member;
 a setting pin provided on said cross arm member;
 a setting plate pivotally coupled to said setting pin;
 a pushbutton to be mounted on one end of said cross arm member;
 a setting spring so provided to surround said setting plate for fixing said setting plate to said cross arm member when said pushbutton is mounted on said cross arm member;
 a sectorial protuberance formed on the bottom surface of the setting plate; and
 a guide hole formed in said cross arm member for receiving said protuberance, the lateral wall of said guide hole which is adapted to contact with said protuberance being symmetrical.

DETAILED DESCRIPTION OF THE PREFERRED EMBODIMENT

Figure 1:
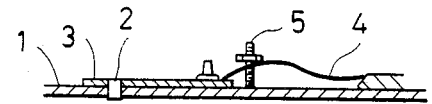
FIG. 1 is a longitudinal sectional view of an example of a conventional cross arm mechanism.
Figure 2:
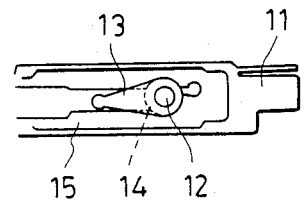
FIGS. 2A and 2B are a plan view and a longitudinal sectional view of another example of the conventional mechanisms, respectively.
Figure 2:
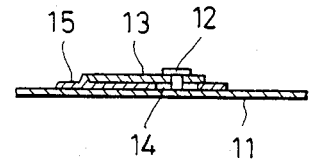
Figure 3:
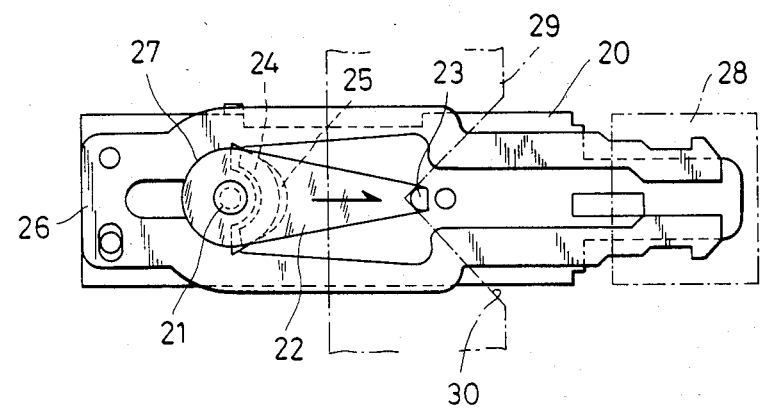
FIG. 3 is a plan view of an embodiment of the cross arm mechanism according to the present invention.
Figure 4:
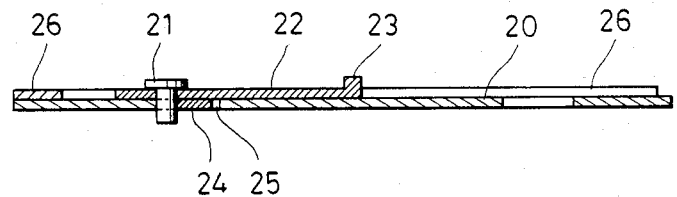
FIG. 4 is a longitudinal sectional view of FIG. 3.

The present invention will now be described in detail referring to the preferred embodiment illustrated in the drawings.

Reference numeral 20 designates a cross arm on which a setting plate 22 is pivotally mounted. More particularly, a setting pin 21 is secured on the cross arm 20 and the setting plate 22 is so coupled on the setting pin 21 to be rotatable thereabout. The setting plate 22 is round at the proximal end thereof near the rear end of the cross arm 20 and substantially triangular at the top end thereof near the front end of the cross arm 20. The triangular end has a protrusion 23 upwardly protruding for engaging with a memory slide.

Further, the setting plate 22 has a sectorial protuberance 24 integrally formed on the bottom surface thereof and extending from the setting pin 21 toward the pushbutton. A substantially V-shaped guide hole 25 is formed in the cross arm 20 for movably receiving the guide protuberance 24 therein. The guide hole 25 is symmetrical about the center line of the cross arm 20 which passes through the center of the setting pin 21. The lateral walls of the guide hole 25 incline in a V-like configuration toward the base end of the cross arm 20 and the periphery of the guide protuberance 24 is adapted to contact with the inclined walls.

A plate spring 26 in a substantially U-like configuration is mounted on the cross arm 20 in a manner surrounding the setting plate 22. The plate spring 26 is secured with one end thereof at the rear end of the cross arm 20 and its right and left legs at both sides of the setting plate 22 extend toward the front end of the cross arm 20. The plate spring 26 has a semicircular grasping portion 27 formed at the inner surface of the secured end thereof. The grasping portion 27 surrounds and is in contact with the proximal end of the setting plate 22 also in a semicircular configuration. Further, on the top ends of the legs of the plate spring 26 is fitted a pushbutton 28. The pushbutton 28 when mounted on the cross arm 20 inwardly suppresses the right and left legs of the plate spring 26 from both sides to thereby narrow the distance while it releases the suppressing force when it is pulled halfway out of the cross arm 20 to thereby permit the legs of the plate spring 26 to outwardly expand.

With this arrangement, the present invention functions as will be described hereunder.

When setting a desired waveband to a given pushbutton and associated cross arm, a tuning shaft is first manually rotated to shift an associated core interlocking, with the tuning shaft up to a predetermined position within an associated coil thus to select a waveband to be set. Owing to this, a memory slide 29 interlocking with the core transversely moves and is set at the position corresponding to the desired frequency. In this state, the pushbutton 28 mounted on the front end of the cross arm 20 and on the legs of the plate spring 26 is pulled out halfway to release the suppressing force against the legs. Then, due to the clearance between the grasping portion 27 of the plate spring 26 and the proximal end of the setting plate 22, the setting plate 22 comes to be freely rotatable about the setting pin 21. When the pushbutton 28 and the cross arm 20 are thereafter pushed in the tuner, the protrusion 23 of the setting plate 22 gets in contact with a V-like notch 30 formed in the memory slide 29 and is guided by the slope of the notch 30 to reach the summit of the same. In this case, since the position of the summit of the V-like notch 30 is determined by the position of the memory slide 29 corresponding to the position of the core within the tuning coil, the setting plate 22 rotates about the setting pin 21 so that the protrusion 23 is located at the summit of the V-like notch 30.

When the cross arm 20 is thus pushed in the tuner to make the protrusion 23 engage with the V-like notch 30 of the memory slide 29, the setting plate 22 is pulled by the V-like notch 30 and tends to move toward the front end of the cross arm 20. Accordingly, the guide protuberance 24 under the setting plate 22 gets in contact with the edge of the guide hole 25 of the cross arm 20 and moves along the lateral wall and toward the front end of the cross arm 20. As the result, even when there exists a play between the setting plate 22 and the setting pin 21 to cause movement of the setting plate 22, the setting plate 22 pulled by the memory slide 29 contacts with the deepest point of the V-shaped guide hole 25 of the cross arm 20. In this case, since the V-like guide hole 25 is symmetrical and the guide protuberance 24 to be fitted thereto has a sectorial periphery, the setting plate 22 is always located with its center line on the center line of the guide hole 25, in other words, the center line of the cross arm 20.

After thus determining the angle of the setting plate 22 at the position of the V-like notch 30 of the memory slide 29 and having the setting plate 22 engage with the guide hole 25 by the force produced at the time, the pushbutton 28 mounted on the front end of the cross arm 20 is pushed in. Then, since the cross arm 20 is prevented from advancing by the memory slide 29, the pushbutton 28 only slides along the surface of the cross arm 20 to be thereby completely coupled to the cross arm 20. In this case, both legs of the plate spring 26 are inwardly pushed by the pushbutton 28, whereby the distance between both legs is narrowed to strongly grasp the proximal end of the setting plate 22. As the result, the setting plate 22 comes to be fixed to the cross arm 20 at an angle corresponding to the position of the V-like notch 30 of the memory slide 29.

Thereafter, when the pushbutton 28 is pushed in the tuner, the protrusion 23 of the setting plate 22 fixed to the cross arm 20 gets in contact with and suppresses the V-like notch 30 to make the memory slide 29 move, so that the position in the associated coil of the core which interlocks with the memory slide is determined.

As described in the foregoing embodiment, the cross arm mechanism according to the present invention comprises the guide hole 25 in a V-like configuration formed in the cross arm 20 and the protuberance 24 of the setting plate 22 having a semicircular periphery inserted in the guide hole 25. And when fixing the setting plate 22 on the cross arm 20 at a predetermined angle, the guide protuberance 24 is suppressed into the narrow portion of the V-like guide hole 25. Therefore, the guide protuberance 24 and the guide hole 25 are always in contact with each other at the same position whereby the center line of the setting plate 22 is always held at a predetermined position. Accordingly, when the setting plate 22 is fixed by the plate spring 26, deviation of the centerline of the setting plate 22 can be prevented and the setting plate 22 can be surely fixed in correspondence with the position of the V-like notch 30 of the memory slide 29. As the result, when the pushbutton is pushed in, the setting plate 22 can move to the position precisely corresponding to the frequency selected by the memory slide 29, so that frequency deviation upon tuning can be completely eliminated.

I claim:

1. A cross arm mechanism for use in a pushbutton tuner, comprising:

an elongated cross arm member;

a setting pin on said cross arm member;

a frequency setting plate disposed on top of and extending longitudinally with respect to said cross arm member, said setting plate being pivotally mounted on said setting pin;

a pushbutton mounted on said cross arm and supported for longitudinal movement between inner and outer positions thereon;

a setting spring partially surrounding said setting plate and having end portions engageable by said pushbutton so that said setting spring is movable between clamping engagement with said setting plate when said pushbutton is in said inner position and non-clamping engagement with said setting plate when said pushbutton is in said outer position whereby said setting plate is fixed with respect to said cross arm member when said pushbutton is in said inner position and is freely rotatable with respect to said cross arm member when said pushbutton is in said outer position;

a downwardly extending first protuberance on the bottom surface of said setting plate, said first protuberance having an arcuate wall extending laterally with respect to said cross arm member;

said cross arm member having an elongated guide hole extending laterally thereon and into which said protuberance extends, said guide hole having symmetrical, oppositely inclined lateral wall sections which are engageable with said arcuate wall of said protuberance and which wall sections are joined to each other at a central juncture located on the longitudinal center line of said cross arm;

an upwardly extending second protuberance on said setting plate at a location thereon remote from said setting pin;

a memory slide disposed above and extending transversely to said cross arm and said setting plate, said memory slide having a notch that opens in a direction toward said pushbutton and narrows to a bottom, said second protuberance being received in said notch so that when said pushbutton is in its inner position and said second protuberance is located at the bottom of said notch, said setting plate is located in a position in which said first protuberance is centered in said guide hole.

2. A cross arm mechanism as claimed in claim 1 in which said setting spring is a substantially U-shaped plate-form member disposed on top of and extending longitudinally with respect to said cross arm member, said setting spring having two opposed spaced-apart legs having free ends received in said pushbutton, said setting spring having a bight portion joining said legs, said bight portion being affixed to said cross arm member and having a substantially semicircular opening partially surrounding the adjacent end of said setting plate so that when said legs are moved toward each other, the wall of said semicircular opening will clamp said setting plate and prevent pivoting movement thereof with respect to said cross arm member, said setting plate extending from said semicircular opening between said legs of said setting spring.

* * * * *